US010374581B2

(12) United States Patent
Shibayama et al.

(10) Patent No.: US 10,374,581 B2
(45) Date of Patent: Aug. 6, 2019

(54) DIGITAL FILTER CIRCUIT, SIGNAL PROCESSING DEVICE, AND DIGITAL FILTER PROCESSING METHOD

(71) Applicant: NEC Corporation, Minato-ku, Tokyo (JP)

(72) Inventors: Atsufumi Shibayama, Tokyo (JP); Junichi Abe, Tokyo (JP); Kohei Hosokawa, Tokyo (JP)

(73) Assignee: NEC CORPORATION, Tokyo (JP)

( * ) Notice: Subject to any disclaimer, the term of this patent is extended or adjusted under 35 U.S.C. 154(b) by 10 days.

(21) Appl. No.: 15/544,042

(22) PCT Filed: Jan. 14, 2016

(86) PCT No.: PCT/JP2016/000159
§ 371 (c)(1),
(2) Date: Jul. 17, 2017

(87) PCT Pub. No.: WO2016/117304
PCT Pub. Date: Jul. 28, 2016

(65) Prior Publication Data
US 2018/0013409 A1 Jan. 11, 2018

(30) Foreign Application Priority Data
Jan. 21, 2015 (JP) ................... 2015-009144

(51) Int. Cl.
G06F 17/14 (2006.01)
H03H 17/02 (2006.01)

(52) U.S. Cl.
CPC ......... H03H 17/0248 (2013.01); G06F 17/14 (2013.01); H03H 17/0202 (2013.01); H03H 17/0213 (2013.01); H03H 2017/0245 (2013.01)

(58) Field of Classification Search
CPC ........... H03H 17/0202; H03H 17/0213; H03H 17/0223; H03H 17/0227; H03H 17/0245; H03H 17/0248; H03H 2218/04
See application file for complete search history.

(56) References Cited

U.S. PATENT DOCUMENTS 7,502,816 B2 * 3/2009 Kumamoto ........... G06F 17/156
708/405
7,526,052 B2 * 4/2009 Davidoff ............ H03H 17/0294
329/315

(Continued)

FOREIGN PATENT DOCUMENTS

| JP | 2011-004264 A | 1/2011 |
| WO | 2013/094308 A1 | 6/2013 |
| WO | 2013/125173 A1 | 8/2013 |

OTHER PUBLICATIONS

International Search Report for PCT Application No. PCT/JP2016/000159, dated Mar. 29, 2016.

(Continued)

Primary Examiner — Andrew Caldwell
Assistant Examiner — Emily E Larocque

(57) ABSTRACT

Provided is a digital filter circuit in which a filter coefficient can be easily changed, for which circuit scale and power consumption can be reduced, and which carries out digital filter processing in a frequency domain. This digital filter circuit includes: a separating circuit for separating a first complex number signal, of a frequency domain that was subjected to Fourier transform, into a real number portion and an imaginary number portion; a filter coefficient generating circuit for generating a first frequency domain filter coefficient from a first input filter coefficient and a third input filter coefficient, and for generating a second frequency domain filter coefficient from a second input filter coefficient and the third input filter coefficient; a first filter that filters (Continued)

the separated real number portion using the first frequency domain filter coefficient; a second filter that filters the separated imaginary number portion using the second frequency domain filter coefficient; and a combining circuit for combining the output from the two filters.

15 Claims, 11 Drawing Sheets

(56) References Cited

U.S. PATENT DOCUMENTS

| | | | |
|---|---|---|---|
| 8,886,693 B2* | 11/2014 | Hauske | H04B 10/2507 708/300 |
| 2010/0325184 A1 | 12/2010 | Kanayama et al. | |
| 2014/0379771 A1 | 12/2014 | Shibayama et al. | |
| 2015/0019608 A1 | 1/2015 | Shibayama et al. | |

OTHER PUBLICATIONS

English translation of Written opinion for PCT Application No. PCT/JP2016/000159.

* cited by examiner

US 10,374,581 B2

DIGITAL FILTER CIRCUIT, SIGNAL PROCESSING DEVICE, AND DIGITAL FILTER PROCESSING METHOD

This application is a National Stage Entry of PCT/JP2016/000159 filed on Jan. 14, 2016, which claims priority from Japanese Patent Application 2015-009144 filed on Jan. 21, 2015, the contents of all of which are incorporated herein by reference, in their entirety.

TECHNICAL FIELD

The present invention relates to a digital filter circuit, a signal processing device, and a digital filter processing method, and more particularly, to a digital filter circuit, a signal processing device, and a digital filter processing method for performing digital signal processing.

BACKGROUND ART

Widely used digital filters perform filtering on signals in a time domain. Some known examples of such digital filters include FIR (Finite Impulse Response) filters and IIR (Infinite Impulse Response) filters. In general, filter processing based on an FIR or IIR filter includes two processes: a filtering process through real-number calculation using a real-number filter coefficient, and a filtering process through complex-number calculation using a complex-number filter coefficient.

The minimum value of taps for an FIR or IIR filter is determined based on the impulse response length of the filter function to be implemented. Thus, to implement a complicated filter function, the required number of taps may be 100 or more. A LSI (Large Scale Integrated) circuit on which an FIR filter involving such large number of taps is mounted poses a problem that the circuit size and power consumption are enormous.

One proposed solution to the problem is to perform a filtering process in a frequency domain. In the filtering process in the frequency domain, a time-domain signal is first transformed into frequency-domain signal data through an FFT (fast Fourier transform). Then, filter calculation is performed on the signal data with a filter coefficient in the frequency domain, followed by an IFFT (inverse fast Fourier transform) through which the signal is retransformed into a time-domain signal.

Performing a filtering process in the frequency domain can reduce the circuit size and power consumption needed for implementing filtering processes despite any large number of taps for an FIR filter. This is because a convoluted calculation in the time domain by means of an FIR filter can be converted into a simple multiplication in the frequency domain.

By the way, in the case where the time-domain signal is a complex-number signal represented by x(n)=r(n)+js(n), where j is an imaginary unit and n is an integer, the complex-number signal in the time domain is transformed into complex-number signal data in the frequency domain through a complex FFT. In the complex FFT, the real part and the imaginary part of a complex-number signal in the time domain are combined and transformed into complex-number signal data in the frequency domain.

FIG. 10 illustrates an example configuration of a digital filter circuit where a complex-number signal in the time domain is transformed into complex-number signal data in the frequency domain through a complex FFT, and then filter calculation is performed in the frequency domain. The digital filter circuit 800 in FIG. 10, which includes three frequency-domain filters 810, 820, and 830, performs filtering on a complex-number signal x(n) (=r(n)+js(n)) in the frequency domain.

The frequency-domain filter 810 transforms a real part signal r(n), which is the real part of an inputted complex-number signal x(n) in the time domain, into complex-number signal data in the frequency domain through an FFT. Next, the frequency-domain filter 810 performs filter calculation in the frequency domain on the frequency-domain complex-number signal data, and then retransforms the data into a time-domain real part signal r'(n) through an IFFT. Although the real part signal r(n) is a real-number signal, a Fourier transform performed on the real-number signal produces complex-number signal data. Usually, a filter coefficient is also a complex number. For this reason, complex-number calculation is required for filter calculation.

The frequency-domain filter 820 transforms a real-number imaginary part signal s(n), which is the imaginary part of an inputted complex-number signal x(n) in the time domain, into complex-number signal data in the frequency domain through an FFT. Next, the frequency-domain filter 820 performs, in the frequency domain and through complex-number calculation, filter calculation on the complex-number signal data in the frequency domain, and then retransforms the data into a real-number imaginary part signal s'(n) in the time domain through an IFFT.

The frequency-domain filter 830 transforms the complex-number signal x'(n)=r'(n)+js'(n), which is composed of the real part signal r'(n) and the imaginary part signal s'(n), into complex-number signal data in the frequency domain through an FFT. Next, the frequency-domain filter 830 performs, in the frequency domain and through complex-number calculation, filter calculation on the complex-number signal data in the frequency domain, and then retransforms the data into a complex-number signal x"(n) in the time domain through an IFFT.

The digital filter circuit 800 in FIG. 10, however, performs filtering processes through separated complex-number calculation on each of the real part and the imaginary part of a time-domain complex-number signal, which means an FFT and an IFFT are required for each of the filtering processes on the real part and the imaginary part.

Hence, the inventors of the present invention proposed a digital filter circuit for performing filtering processes in the frequency domain through a minimum number of FFTs and IFFTs (PTL 1). FIG. 11 illustrates a block configuration diagram of the digital filter circuit according to PTL 1.

In the digital filter circuit 900 illustrated in FIG. 11, the complex conjugate generating circuit 920 uses complex-number signal data X(k) and X(N−k) in the frequency domain, which have been outputted from the FFT circuit 910, to generate complex-number signal data X(k) and complex conjugate data X*(N−k), which are then outputted to the filter circuits 940 and 950, respectively. On the other hand, the filter coefficient generating circuit 930 uses complex-number coefficients V(k), W(k), and H(k), which have been given by a higher-level circuit, to generate complex-number coefficients C1(k) and C2(N−k), which are then outputted to the filter circuits 940 and 950, respectively.

The filter circuits 940 and 950 then perform filtering processes on the complex-number signal data X(k) and the complex conjugate data X*(N−k) with the complex-number coefficients C1(k) and C2(N−k), respectively, to generate complex-number signal data X'(k) and complex conjugate data X*'(N−k). Next, the complex conjugate combining circuit 960 combines the complex-number signal data X'(k)

with the complex conjugate data X*'(N−k) to output X"(k), which is then subjected to an IFFT process in the IFFT circuit 970 to output x"(k).

Setting appropriate complex-number coefficients V(k), W(k), and H(k) needs only one FFT and one IFFT for filter processing in the frequency domain, thereby reducing the circuit size and power consumption.

CITATION LIST

Patent Literature

[PTL 1] International Publication WO 2013/125173

SUMMARY OF INVENTION

Technical Problem

The digital filter circuit 900 according to PTL 1, however, is problematic in that the process of changing a complex-number coefficient may be complicated resulting in a longer time needed for changing the complex-number coefficient, because the complex-number coefficient C1(k) correlates with the complex-number coefficient C2(N−k).

The present invention has been created in view of the problem described above, and an object of the invention is to provide a digital filter circuit, a signal processing device, and a digital filter processing method that are used for performing digital filtering processes in the frequency domain and that enable both changing filter coefficients with ease and reducing the circuit size and power consumption.

Solution to Problem

To achieve the aforementioned object, a digital filter circuit according to the present invention includes: separating means for separating a first complex-number signal in a frequency domain, into which a complex-number signal in a time domain has been transformed through a Fourier transform, into a second complex-number signal in the frequency domain and a third complex-number signal in the frequency domain, the second complex-number signal corresponding to a real part of the complex-number signal in the time domain, and the third complex-number signal corresponding to an imaginary part of the complex-number signal in the time domain; filter coefficient generating means for accepting inputted first, second, and third input filter coefficients that are complex-numbers, and generating a first frequency-domain filter coefficient that is a complex number from the first input filter coefficient and third input filter coefficients, and generating a second frequency-domain filter coefficient that is a complex number from the second and third input filter coefficients; a first filter for performing a filtering process on the second complex-number signal with the first frequency-domain filter coefficient and outputting a fourth complex-number signal; a second filter for performing a filtering process on the third complex-number signal with the second frequency-domain filter coefficient and outputting a fifth complex-number signal; and combining means for combining the fourth complex-number signal with the fifth complex-number signal and generating a sixth complex-number signal.

To achieve the aforementioned object, a signal processing device according to the present invention includes the above-described digital filter circuit.

To achieve the aforementioned object, a digital filter processing method according to the present invention includes: separating a first complex-number signal in a frequency domain, into which a complex-number signal in a time domain has been transformed through a Fourier transform, into a second complex-number signal in the frequency domain and a third complex-number signal in the frequency domain, the second complex-number signal corresponding to a real part of the complex-number signal in the time domain, and the third complex-number signal corresponding to an imaginary part of the complex-number signal in the time domain; generating a first frequency-domain filter coefficient that is a complex number from first input filter coefficient and third input filter coefficients that are complex numbers and have been inputted; generating a second frequency-domain filter coefficient that is a complex number from a second input filter coefficient that is a complex number and the third input filter coefficient that have been inputted; performing a filtering process on the second complex-number signal with the first frequency-domain filter coefficient and outputting a fourth complex-number signal; performing a filtering process on the third complex-number signal with the second frequency-domain filter coefficient and outputting a fifth complex-number signal; and combining the fourth complex-number signal with the fifth complex-number signal and generating a sixth complex-number signal.

Advantageous Effects of Invention

According to the aforementioned aspects of the present invention, filter coefficients can be easily changed and the circuit size and power consumption can be reduced with a digital filter circuit, a signal processing device, and a digital filter processing method that are used for performing digital filtering processes in the frequency domain.

DESCRIPTION OF EMBODIMENTS

First Example Embodiment

Figure 1:
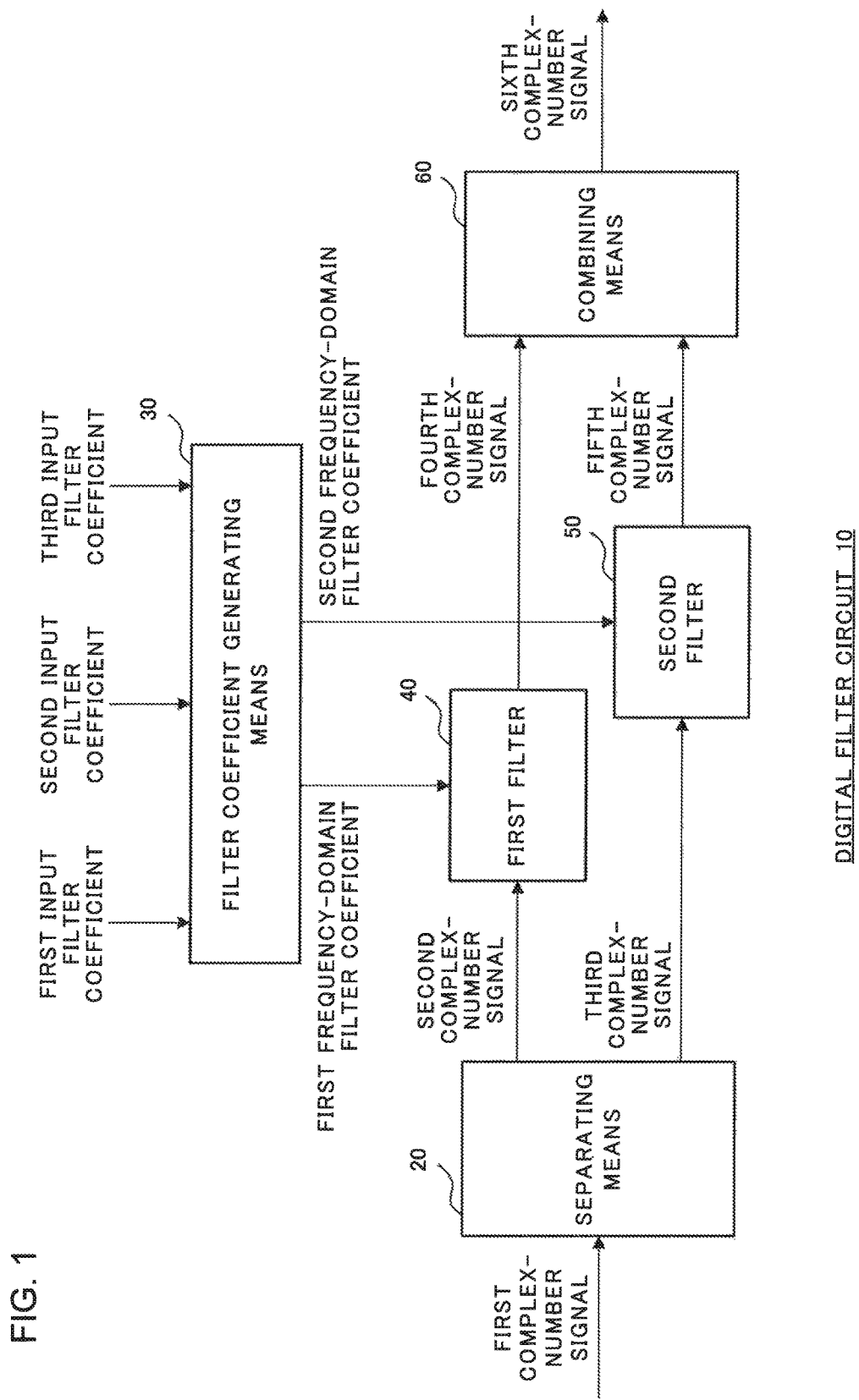
FIG. 1 is a block configuration diagram illustrating a digital filter circuit 10 according to a first example embodiment.

A first example embodiment of the present invention will now be described. FIG. 1 is a block configuration diagram illustrating a digital filter circuit according to the present example embodiment. With reference to FIG. 1, the digital filter circuit 10 includes separating means 20, filter coefficient generating means 30, a first filter 40, a second filter 50, and combining means 60.

The separating means 20 separates a first complex-number signal into a second complex-number signal and a third complex-number signal, the first complex-number signal being a complex-number signal in the frequency domain produced through a Fourier transform performed on a complex-number signal in the time domain, the second complex-number signal being a complex-number signal in the frequency domain corresponding to the real part of the complex-number signal in the time domain, and the third complex-number signal being a complex-number signal in the frequency domain corresponding to the imaginary part of the complex-number signal in the time domain. The separating means 20 outputs the second complex-number signal and the third complex-number signal, which have been produced through separation, to the first filter 40 and the second filter 50, respectively.

To the filter coefficient generating means 30, first, second, and third input filter coefficients, which are complex-numbers, are inputted. The filter coefficient generating means 30 generates a first frequency-domain filter coefficient that is a complex-number from the inputted first input filter coefficient and third input filter coefficient, and outputs the generated coefficient to the first filter 40. The filter coefficient generating means 30 generates a second frequency-domain filter coefficient that is a complex-number from the inputted second input filter coefficient and third input filter coefficient, and outputs the generated coefficient to the second filter 50.

The first filter 40 performs a filtering process on the second complex-number signal, which has been inputted from the separating means 20, with the first frequency-domain filter coefficient, which has been inputted from the filter coefficient generating means 30, and then outputs a fourth complex-number signal to the combining means 60.

The second filter 50 performs a filtering process on the third complex-number signal, which has been inputted from the separating means 20, with the second frequency-domain filter coefficient, which has been inputted from the filter coefficient generating means 30, and then outputs a fifth complex-number signal to the combining means 60.

The combining means 60 combines the fourth complex-number signal with the fifth complex-number signal, and outputs a resulting signal as a sixth complex-number signal. The sixth complex-number signal, which has been outputted from the combining means 60, is subjected to an inverse Fourier transform in an IFFT circuit (not illustrated) to be transformed back into a complex-number signal in the time domain.

The foregoing first, second, and third input filter coefficients are complex-number filter coefficients in the frequency domain respectively corresponding to filter coefficients for time-domain filtering processes, that is, filtering processes performed in the time domain on complex-number signals in the time domain. Specifically, the first input filter coefficient corresponds to the filter coefficient for a filtering process through real-number calculation in the time domain performed on the real part of a complex-number signal in the time domain. The second input filter coefficient corresponds to the filter coefficient for a filtering process through real-number calculation in the time domain performed on the imaginary part of a complex-number signal in the time domain. The third input filter coefficient corresponds to the filter coefficient for a filtering process through complex-number calculation in the time domain performed on a complex-number signal in the time domain.

In the digital filter circuit 10 according to the present example embodiment, the filter coefficient generating means 30 generates a first frequency-domain filter coefficient from the first input filter coefficient and third input filter coefficient, while generating a second frequency-domain filter coefficient from the second input filter coefficient and third input filter coefficient. In this case, each of the first input filter coefficient and second input filter coefficient can be independently adjusted by changing the first frequency-domain filter coefficient and the second frequency-domain filter coefficient relative to the real part and the imaginary part, respectively. Accordingly, the first input filter coefficient and second input filter coefficient can be easily adjusted.

In addition, in the digital filter circuit 10, the separating means 20 separates a first complex-number signal, which is a complex-number signal in the frequency domain produced through a Fourier transform performed on a complex-number signal in the time domain, into a second complex-number signal and a third complex-number signal, which correspond to the real part and the imaginary part, respectively. The first filter 40 and the second filter 50 then perform filtering processes on the second complex-number signal and third complex-number signals, with the aforementioned first frequency-domain filter coefficient and second frequency-domain filter coefficients, respectively. This needs only one Fourier transform on a complex-number signal in the time domain inputted to the digital filter circuit 10, and only one inverse Fourier transform on a complex-number signal in the frequency domain outputted from the digital filter circuit 10.

Therefore, the digital filter circuit 10 according to the present example embodiment can perform digital filtering processes in the frequency domain while enabling both changing an input filter coefficient with ease and preventing an increase in the circuit size and power consumption.

Second Example Embodiment

Figure 2:
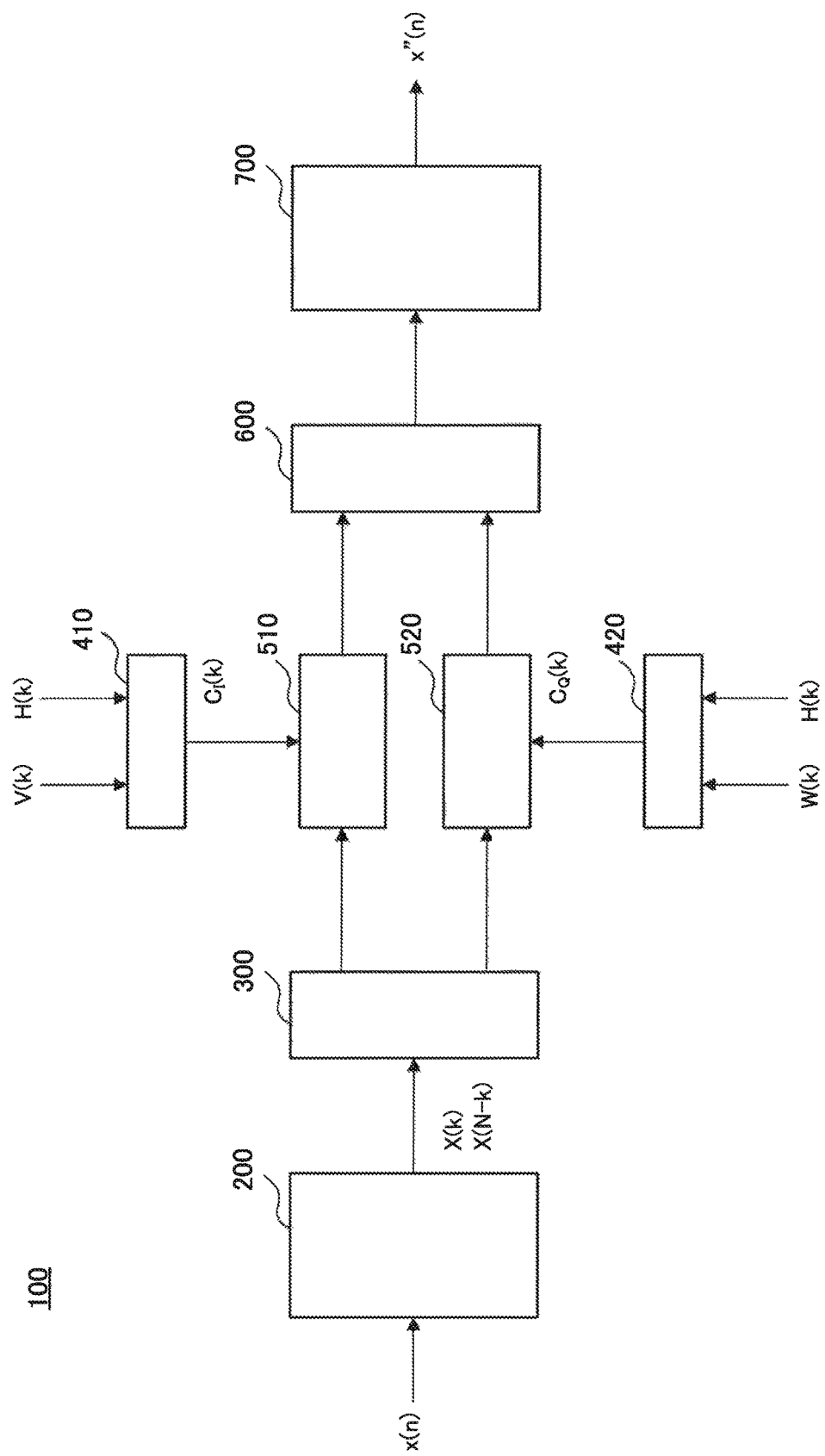
FIG. 2 is a block configuration diagram illustrating a digital filter circuit 100 according to a second example embodiment.

A second example embodiment will now be described. FIG. 2 is a block configuration diagram illustrating a digital filter circuit according to the present example embodiment. With reference to FIG. 2, the digital filter circuit 100 includes an FFT circuit 200, an IQ separating circuit 300, a filter coefficient generating circuits 410 and 420, filter circuits 510 and 520, an IQ combining circuit 600, and an IFFT circuit 700.

To the FFT circuit 200, a complex-number signal in the time domain x(n) as expressed by Equation (1) is inputted.

$$x(n)=r(n)+js(n) \qquad \text{Equation (1)}$$

The FFT circuit 200 performs an FFT on the inputted complex-number signal in the time domain x(n) to transform the signal into complex-number signal data in the frequency domain X(k) as expressed by Equation (2), and outputs the signal data to the IQ separating circuit 300.

$$X(k)=A(k)+jB(k) \quad \text{Equation (2)}$$

In the equations, n is an integer satisfying $0 \le n \le N-1$ representing a signal sample number in the time domain, and k is an integer satisfying $0 \le k \le N-1$ representing a frequency number in the frequency domain, where N is an integer representing the number of samples transformed through FFT. Note that FFT is one of techniques for performing a Fourier transform quickly, which means a technique other than FFT may be used to perform a Fourier transform.

The FFT circuit 200 further generates complex-number signal data in the frequency domain X(N−k), which is expressed by Equation (3), from the complex-number signal data in the frequency domain X(k), and outputs the signal data to the IQ separating circuit 300.

$$X(N-k)=A(N-k)+jB(N-k) \quad \text{Equation (3)}$$

Figure 3:
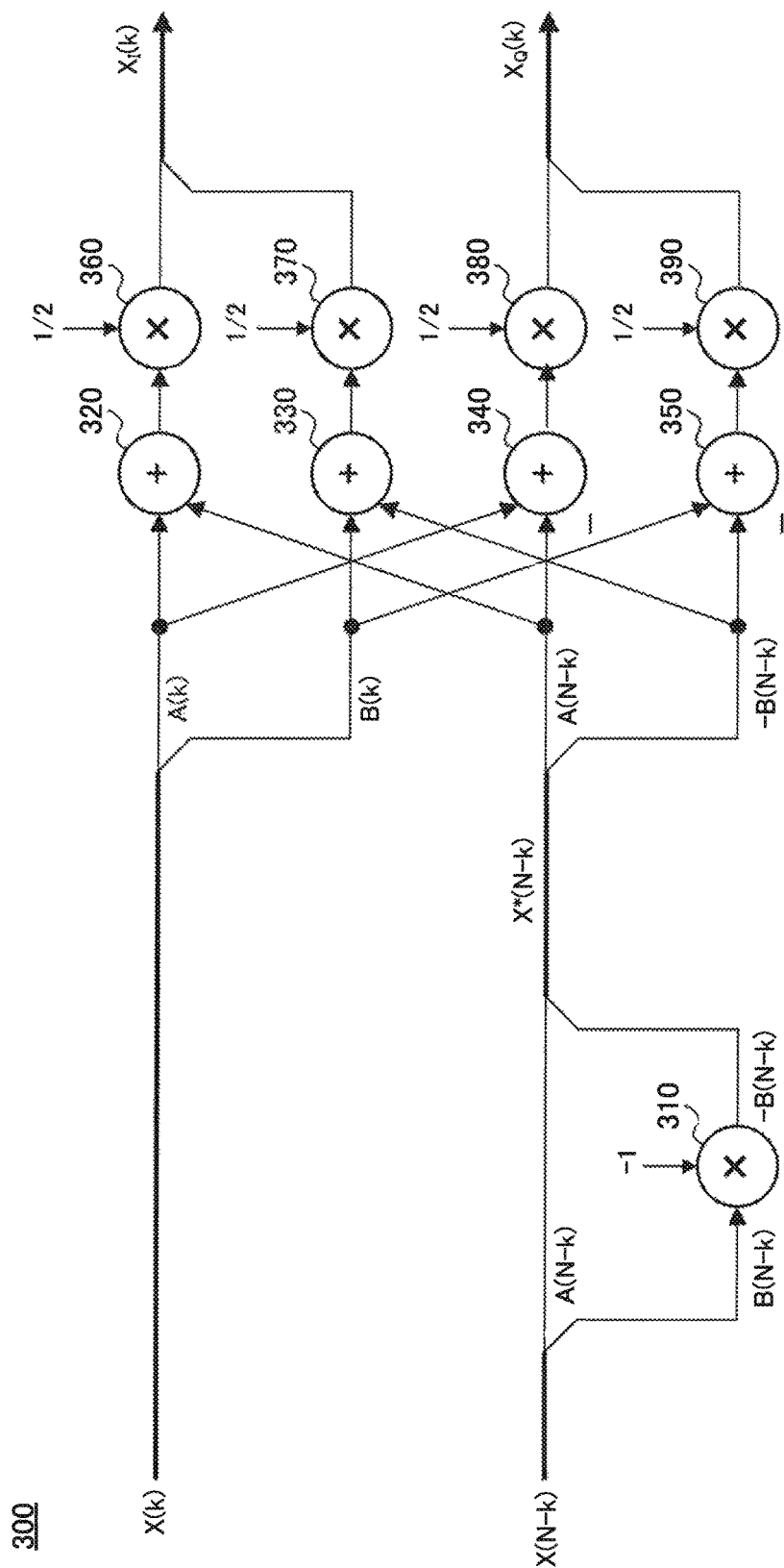
FIG. 3 is a block configuration diagram illustrating an IQ separating circuit 300 according to the second example embodiment.

To the IQ separating circuit 300, the complex-number signal data X(k) expressed by Equation (2) and the complex-number signal data X(N−k) expressed by Equation (3) are inputted. FIG. 3 is a block configuration diagram illustrating the IQ separating circuit 300. With reference to FIG. 3, the IQ separating circuit 300 includes a complex conjugate generating unit 310, adding units 320 and 330, subtracting units 340 and 350, and multiplying units 360, 370, 380, and 390. In FIG. 3, complex-number signals are drawn in thick lines while real-number signals are drawn in thin lines. The same applies hereinafter to the other drawings.

The complex-number signal data X(N−k) is inputted to the IQ separating circuit 300, and only its imaginary part, B(N−k), passes through the complex conjugate generating unit 310. The real part, A(N−k), is then combined with −B(N−k), which has been produced through the complex conjugate generating unit 310, to generate complex conjugate data X*(N−k) as expressed by Equation (4). The complex conjugate data X*(N−k) expressed by Equation (4) is generated from the inputted complex-number signal data X(N−k) for every frequency number k satisfying $0 \le k \le N-1$.

$$X^*(N-k)=A(N-k)-jB(N-k) \quad \text{Equation (4)}$$

The adding units 320 and 330, the subtracting units 340 and 350, and the multiplying units 360, 370, 380, and 390 generate $X_I(k)$ and $X_Q(k)$ derived from the complex-number signal data X(k), which has been inputted, and from the complex conjugate data X*(N−k), which has been produced through the complex conjugate generating unit 310, where $X_I(k)$ is I component signal data as expressed by Equation (5), and $X_Q(k)$ is Q component signal data as expressed by Equation (6).

$$X_I(k)=\{X(k)+X^*(N-k)\}/2=\{A(k)+A(N-k)\}/2+j\{B(k)-B(N-k)\}/2 \quad \text{Equation (5)}$$

$$X_Q(k)=\{X(k)-X^*(N-k)\}/2=\{A(k)-A(N-k)\}/2+j\{B(k)+B(N-k)\}/2 \quad \text{Equation (6)}$$

Specifically, the first adding unit 320 adds the real part of the complex-number signal data X(k) to the real part of the complex conjugate data X*(N−k), while the second adding unit 330 adds the imaginary part of the complex-number signal data X(k) to the imaginary part of the complex conjugate data X*(N−k). The first subtracting unit 340 subtracts the real part of the complex conjugate data X*(N−k) from the real part of the complex-number signal data X(k), while the second subtracting unit 350 subtracts the imaginary part of the complex conjugate data X*(N−k) from the imaginary part of the complex-number signal data X(k).

The multiplying units 360, 370, 380, and 390 multiply the outputs from the first adding unit 320, the second adding unit 330, the first subtracting unit 340, and the second subtracting unit 350, respectively, by the predetermined coefficient, ½.

Then, the outputs from the multiplying units 360 and 370, which constitute the I component signal data $X_I(k)$, are outputted to the filter circuit 510, while the outputs from the multiplying units 380 and 390, which constitute the Q component signal data $X_Q(k)$, are outputted to the filter circuit 520, where $X_I(k)$ and $X_Q(k)$ each can be divided into the real and imaginary parts and expressed by Equations (7) and (8), respectively:

$$X_I(k)=X_{II}(k)+jX_{IQ}(k) \quad \text{Equation (7)}$$

$$X_Q(k)=X_{QI}(k)+jX_{QQ}(k) \quad \text{Equation (8)}$$

Figure 4:
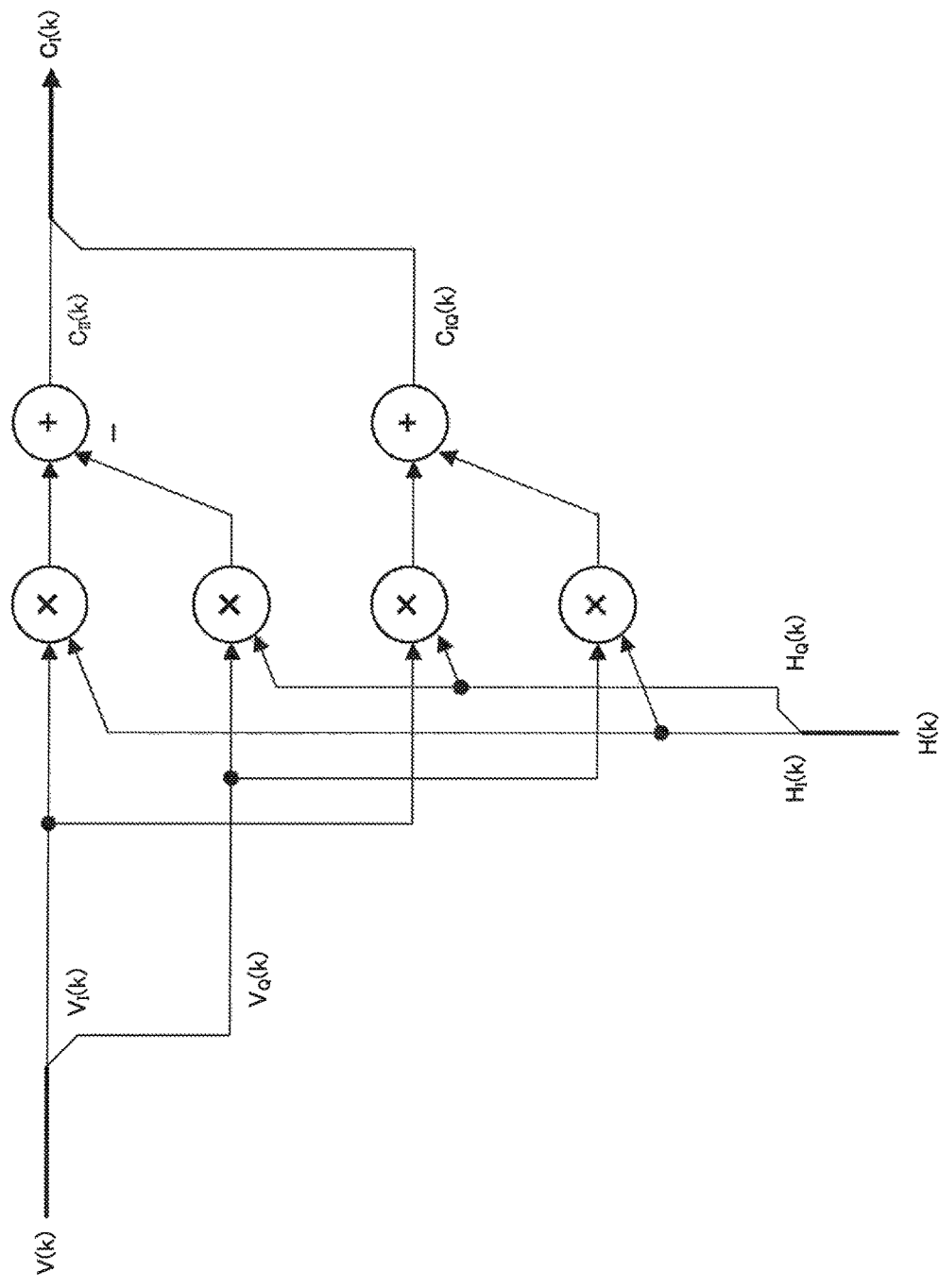
FIG. 4 is a block configuration diagram illustrating a filter coefficient generating circuit 410 according to the second example embodiment.

The filter coefficient generating circuit 410 generates a complex-number coefficient $C_I(k)$ by performing a complex multiplication of a complex-number coefficient V(k), which has been inputted from a higher-level circuit of the digital filter circuit 100, by a complex-number coefficient H(k), which has been inputted from a higher-level circuit of the digital filter circuit 100. FIG. 4 is a block configuration diagram illustrating the filter coefficient generating circuit 410. The filter coefficient generating circuit 410 in FIG. 4 uses the inputted complex-number coefficients V(k) and H(k) to generate a complex-number coefficient $C_I(k)$ as expressed by Equation (9) for every frequency number k satisfying $0 \le k \le N-1$, and outputs the generated coefficient to the filter circuit 510.

$$C_I(k)=V(k) \times H(k) \quad \text{Equation (9)}$$

where V(k) and H(k) each can be divided into the real and imaginary parts and expressed by Equations (10) and (11), respectively:

$$V(k)=V_I(k)+jV_Q(k) \quad \text{Equation (10)}$$

$$H(k)=H_I(k)+jH_Q(k) \quad \text{Equation (11)}$$

Assigning Equations (10) and (11) to Equation (9) leads to Equation (12), which describes the complex-number coefficient $C_I(k)$:

$$C_I(k)=\{V_I(k)+jV_Q(k)\} \times \{H_I(k)+jH_Q(k)\}=C_{II}(k)+jC_{IQ}(k) \quad \text{Equation (12)}$$

where $C_{II}(k)$ and $C_{IQ}(k)$ are the real part and the imaginary part of the complex-number coefficient $C_I(k)$, as expressed by Equations (13) and (14), respectively.

$$C_{II}(k)=V_I(k) \times H_I(k)-V_Q(k) \times H_Q(k) \quad \text{Equation (13)}$$

$$C_{IQ}(k)=V_Q(k) \times H_I(k)+V_I(k) \times H_Q(k) \quad \text{Equation (14)}$$

Figure 5:
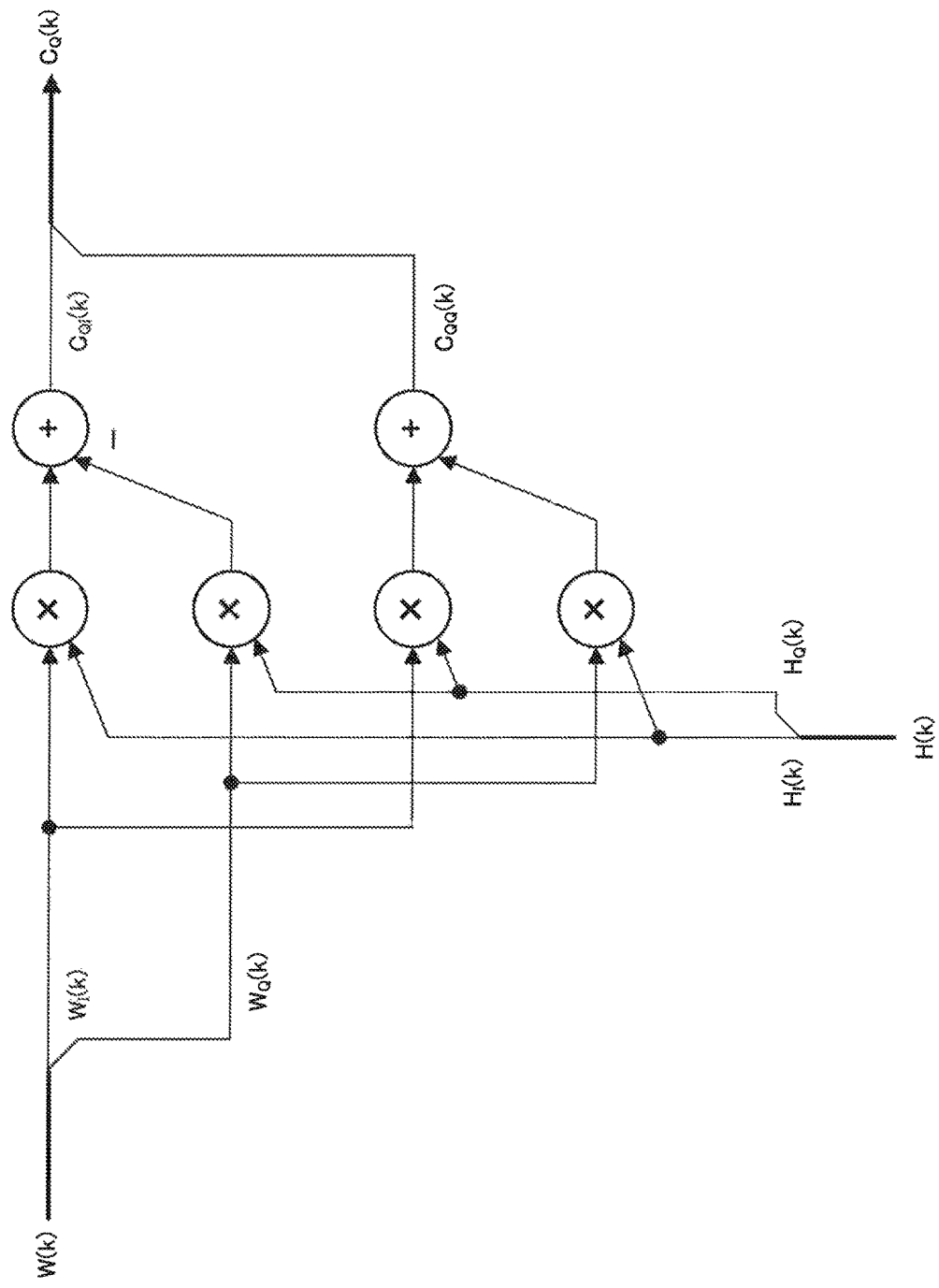
FIG. 5 is a block configuration diagram illustrating a filter coefficient generating circuit 420 according to the second example embodiment.

The filter coefficient generating circuit 420 generates a complex-number coefficient $C_Q(k)$ by performing a complex multiplication of a complex-number coefficient W(k), which has been inputted from a higher-level circuit of the digital filter circuit 100, by a complex-number coefficient H(k), which has been inputted from a higher-level circuit of the digital filter circuit 100. FIG. 5 is a block configuration diagram illustrating the filter coefficient generating circuit 420. The filter coefficient generating circuit 420 in FIG. 5 uses the inputted complex-number coefficients W(k) and H(k) to generate a complex-number coefficient $C_Q(k)$ as expressed by Equation (15) for every frequency number k satisfying $0 \le k \le N-1$ and outputs the generated coefficient to the filter circuit 520.

$$C_Q(k)=W(k) \times H(k) \quad \text{Equation (15)}$$

where W(k) can also be divided into the real and imaginary parts and expressed by Equation (16):

$$W(k)=W_I(k)+jW_Q(k) \quad \text{Equation (16)}$$

Assigning Equations (11) and (16) to Equation (15) leads to Equation (17), which describes the complex-number coefficient $C_Q(k)$:

$$C_Q(k)=\{W_I(k)+jW_Q(k)\} \times \{H_I(k)+jH_Q(k)\}=C_{QI}(k)+jC_{QQ}(k) \quad \text{Equation (17)}$$

where $C_{QI}(k)$ and $C_{QQ}(k)$ are the real part and the imaginary part of the complex-number coefficient $C_Q(k)$, as expressed by Equations (18) and (19), respectively.

$$C_{QI}(k)=W_I(k) \times H_I(k)-W_Q(k) \times H_Q(k) \quad \text{Equation (18)}$$

$$C_{QQ}(k)=W_Q(k) \times H_I(k)+W_I(k) \times H_Q(k) \quad \text{Equation (19)}$$

Figure 6:
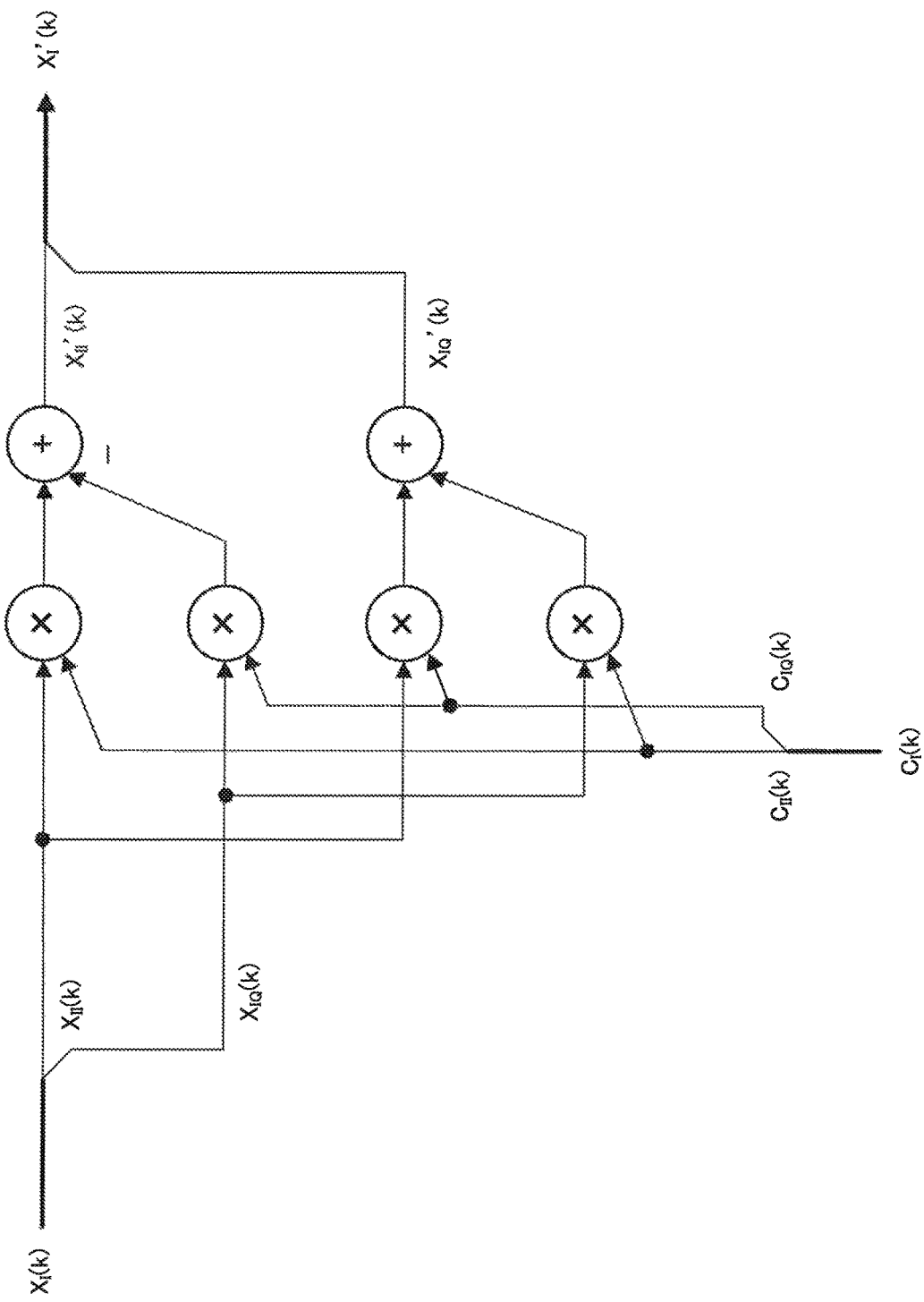
FIG. 6 is a block configuration diagram illustrating a filter circuit 510 according to the second example embodiment.

To the filter circuit 510, the I component signal data $X_I(k)$, which has been outputted from the IQ separating circuit 300 and is expressed by Equation (7), and the complex-number coefficient $C_I(k)$, which has been outputted from the filter coefficient generating circuit 410 and is expressed by Equation (12), are inputted. FIG. 6 is a block configuration diagram illustrating the filter circuit 510.

The filter circuit 510 performs a complex-number filtering process through complex-number multiplication of the inputted I component signal data $X_I(k)$ by the inputted complex-number coefficient $C_I(k)$. Specifically, the filter circuit 510 calculates complex-number signal data $X_I'(k)$, which is expressed by Equation (20), for every frequency number k satisfying 0≤k≤N−1 and outputs the calculated data to the IQ combining circuit 600.

$$X_I'(k) = X_I(k) \times C_I(k) \quad \text{Equation (20)}$$
$$= \{X_{II}(k) + jX_{IQ}(k)\} \times \{C_{II}(k) + jC_{IQ}(k)\}$$
$$= X_{II}'(k) + jX_{IQ}'(k)$$

where $X_{II}'(k)$ and $X_{IQ}'(k)$ are the real part and the imaginary part of $X_I'(k)$, as expressed by Equations (21) and (22), respectively.

$$X_{II}'(k)=X_{II}(k) \times C_{II}(k)-X_{IQ}(k) \times C_{IQ}(k) \quad \text{Equation (21)}$$

$$X_{IQ}'(k)=X_{II}(k) \times C_{IQ}(k)+X_{IQ}(k) \times C_{II}(k) \quad \text{Equation (22)}$$

Figure 7:
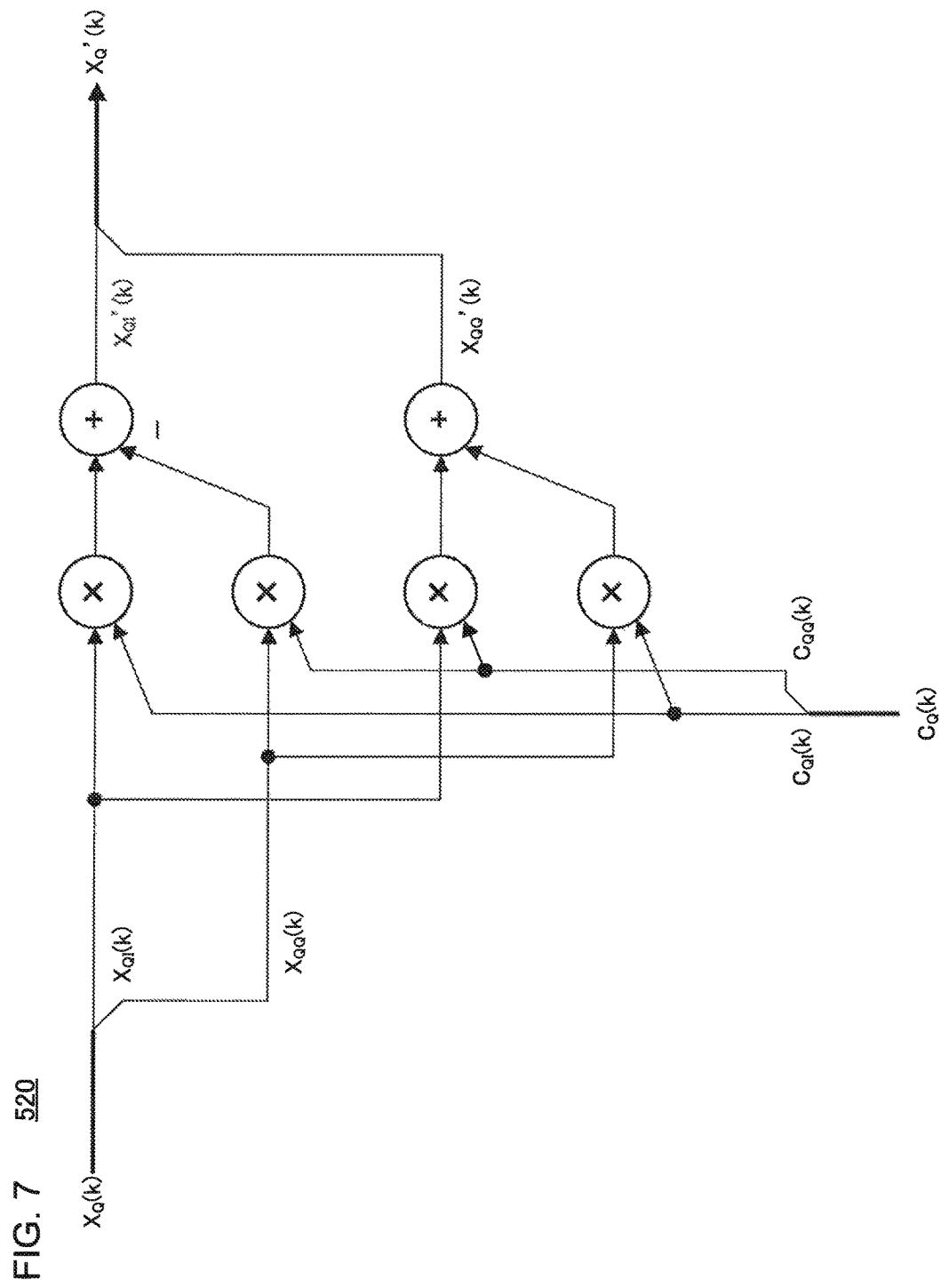
FIG. 7 is a block configuration diagram illustrating a filter circuit 520 according to the second example embodiment.

To the filter circuit 520, the Q component signal data $X_Q(k)$, which has been outputted from the IQ separating circuit 300 and is expressed by Equation (8), and the complex-number coefficient $C_Q(k)$, which has been outputted from the filter coefficient generating circuit 420 and is expressed by Equation (17), are inputted. FIG. 7 is a block configuration diagram illustrating the filter circuit 520.

The filter circuit 520 performs a complex-number filtering process through complex-number multiplication of the inputted Q component signal data $X_Q(k)$ by the inputted complex-number coefficient $C_Q(k)$. Specifically, the filter circuit 520 calculates complex-number signal data $X_Q'(k)$, which is expressed by Equation (23), for every frequency number k satisfying 0≤k≤N−1 and outputs the calculated data to the IQ combining circuit 600.

$$X_Q'(k) = X_Q(k) \times C_Q(k) \quad \text{Equation (23)}$$
$$= \{X_{QI}(k) + jX_{QQ}(k)\} \times \{C_{QI}(k) + jC_{QQ}(k)\}$$
$$= X_{QI}'(k) + jX_{QQ}'(k)$$

where $X_{QI}'(k)$ and $X_{QQ}'(k)$ are the real part and the imaginary part of the complex-number signal data $X_Q'(k)$, as expressed by Equations (24) and (25), respectively.

$$X_{QI}'(k)=X_{QI}(k) \times C_{QI}(k)-X_{QQ}(k) \times C_{QQ}(k) \quad \text{Equation (24)}$$

$$X_{QQ}'(k)=X_{QI}(k) \times C_{QQ}(k)+X_{QQ}(k) \times C_{QI}(k) \quad \text{Equation (25)}$$

The IQ combining circuit 600 combines the complex-number signal data $X_I'(k)$, which has been inputted from the filter circuit 510 and is expressed by Equation (20), with the complex-number signal data $X_Q'(k)$, which has been inputted from the filter circuit 520 and is expressed by Equation (23), for every frequency number k satisfying 0≤k≤N−1, to generate complex-number signal data X"(k) as expressed by Equation (26), and outputs the generated data to the IFFT circuit 700.

$$X''(k) = X_I'(k) + X_Q'(k) \quad \text{Equation (26)}$$
$$= \{X_{II}'(k) + jX_{IQ}'(k)\} + \{X_{QI}'(k) + jX_{QQ}'(k)\}$$
$$= X_I''(k) + jX_Q''(k)$$

where $X_I''(k)$ and $X_Q''(k)$ are the real part and the imaginary part of the complex-number signal data X"(k), as expressed by Equations (27) and (28), respectively.

$$X_I''(k)=X_{II}'(k)+X_{QI}'(k) \quad \text{Equation (27)}$$

$$X_Q''(k)=X_{IQ}'(k)+X_{QQ}'(k) \quad \text{Equation (28)}$$

where $X_{II}'(k)$, $X_{IQ}'(k)$, $X_{QI}'(k)$, and $X_{QQ}'(k)$ are expressed by Equations (21), (22), (24), and (25), respectively.

Figure 8:
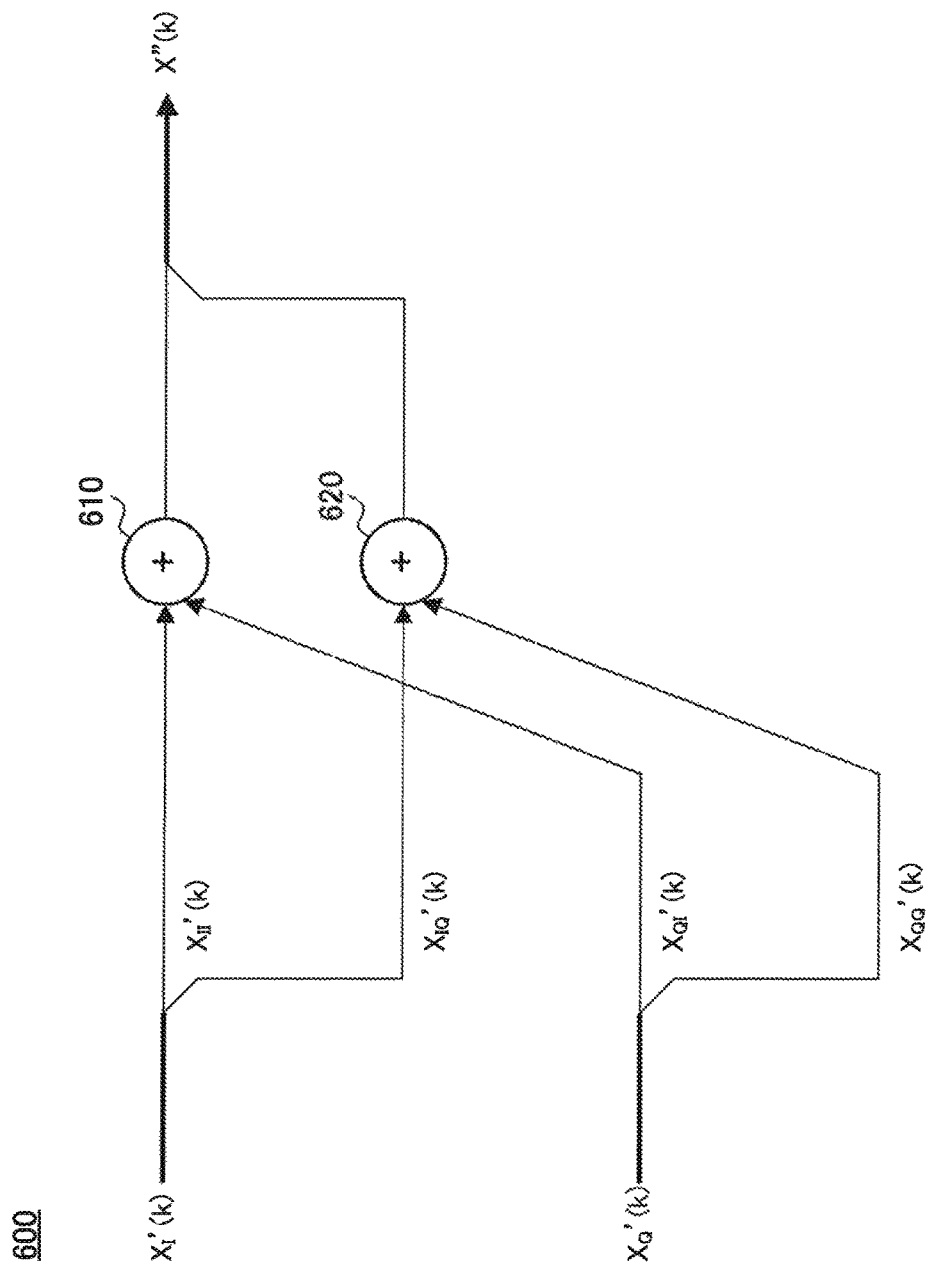
FIG. 8 is a block configuration diagram illustrating an IQ combining circuit 600 according to the second example embodiment.

FIG. 8 is an example block configuration diagram illustrating the IQ combining circuit 600. The IQ combining circuit 600 in FIG. 8 includes first adding means 610 for adding the real part of complex-number signal data $X_I'(k)$ to the real part of complex-number signal data $X_Q'(k)$, and second adding means 620 for adding the imaginary part of complex-number signal data $X_I'(k)$ to the imaginary part of complex-number signal data $X_Q'(k)$. Then, the output from the first adding means 610 and the output from the second adding means 620, which constitute complex-number signal data X"(k), are outputted to the IFFT circuit 700.

The IFFT circuit 700 performs an IFFT on the inputted complex-number signal data X"(k) for each frequency number k satisfying 0≤k≤N−1 to generate a complex-number signal x"(n) in the time domain and outputs the generated signal. Note that IFFT is one of techniques for performing an inverse Fourier transform quickly, which means a technique other than IFFT may be used to perform an inverse Fourier transform.

The digital filter circuit 100 configured as above performs an FFT on a complex-number signal in the time domain x(n) to generate complex-number signal data in the frequency-domain X(k), and then independently filters the real part and the imaginary part of the complex-number signal data in the frequency domain with two different complex-number coefficients $C_I(k)$ and $C_Q(k)$, which have been generated from V(k), W(k), and H(k). That is, the filter circuits 510 and 520 each independently perform a filtering process on the I component signal data $X_I(k)$ expressed by Equation (7) and on the Q component signal data $X_Q(k)$ expressed by Equation (8), both of which have been inputted from the IQ separating circuit 300, with the complex-number coefficient $C_I(k)$ expressed by Equation (12) and the complex-number coefficient $C_Q(k)$ expressed by Equation (17), which have been inputted from the filter coefficient generating circuits 410 and 420, respectively. Then, the digital filter circuit 100 inversely transforms the resulting data into a complex-number signal in the time domain x"(n) through the IFFT circuit 700.

As seen above, the digital filter circuit 100 according to the present example embodiment performs only one FFT and only one IFFT with respect to the complex-number signal in the time domain x(n) and the complex-number signal x"(k), respectively. This is because the numbers of FFTs and IFFTs can be minimized by two different complex-number coefficients used for filtering processes, $C_I(k)$ and $C_Q(k)$, which are generated from V(k), W(k), and H(k).

The following defines V(k), W(k), and H(k) in a physical sense, and describes the principle on which a filtering process in the frequency domain equivalent to a filtering process in the time domain is achieved by filtering processes with complex-number coefficients $C_I(k)$ and $C_Q(k)$, which have been generated from V(k), W(k), and H(k).

In the digital filter circuit 100 according to the present example embodiment, the FFT circuit 200 performs a complex FFT on an inputted complex-number signal in the time domain x(n) (=r(n)+js(n)) as expressed by Equation (1) to generate complex-number signal data in the frequency domain X(k) as expressed by Equation (29).

$$X(k)=R(k)+jS(k) \qquad \text{Equation (29)}$$

where R(k) is complex-number signal data in the frequency domain produced through a real FFT performed on the real-number real part signal r(n) in the time domain, while S(k) is complex-number signal data in the frequency domain produced through a real FFT performed on the real-number imaginary part signal s(n) in the time domain. That is, R(k) corresponds to r(n) while S(k) corresponds to s(n). Then, Equation (30) is established from complex conjugate symmetry:

$$X^*(N-k)=R(k)-jS(k) \qquad \text{Equation (30)}$$

where the complex-number signal data $X^*(N-k)$ is the complex conjugate of the complex-number signal data X(N−k). Then, from X(k) and $X^*(N-k)$ as expressed by Equations (29) and (30), respectively, the IQ separating circuit 300 generates the I-component signal data $X_I(k)$ expressed by Equation (5) and the Q-component signal data $X_Q(k)$ expressed by Equation (6). From Equations (5), (6), (29), and (30), $X_I(k)$ and $X_Q(k)$ can be described as Equations (31) and (32), respectively.

$$X_I(k)=\{X(k)+X^*(N-k)\}/2=R(k) \qquad \text{Equation (31)}$$

$$X_Q(k)=\{X(k)-X^*(N-k)\}/2=jS(k) \qquad \text{Equation (32)}$$

Then, from Equations (9), (20), (31), and (32), the complex-number signal data $X_I'(k)$ can be described as Equation (33):

$$X_I'(k)=X_I(k)\times C_I(k)=R(k)\times V(k)\times H(k) \qquad \text{Equation (33)}$$

From Equations (15), (23), (31), and (32), the complex-number signal data $X_Q'(k)$ can be described as Equation (34):

$$X_Q'(k)=X_Q(k)\times C_Q(k)=jS(k)\times W(k)\times H(k) \qquad \text{Equation (34)}$$

Assigning Equations (33) and (34) to Equation (26) leads to Equation (35) describing the complex-number signal data X"(k):

$$X''(k)=X_I'(k)+X_Q'(k)$$
$$=R(k)V(k)H(k)+jS(k)W(k)H(k)$$
$$=\{R(k)V(k)+jS(k)W(k)\}\times H(k) \qquad \text{Equation (35)}$$

Equation (35) describes the complex-number signal data X"(k), which has been outputted from the IQ combining circuit 600 and is going to undergo an IFFT, expressed with V(k), W(k), and H(k), which are filter coefficients, and with R(k) and S(k) in the complex-number signal data X(k), which has undergone an FFT and is going to be inputted to the IQ separating circuit 300.

As described above, R(k) is complex-number signal data in the frequency domain produced through a real FFT performed on the real-number real part signal r(n) in the time domain, while S(k) is complex-number signal data in the frequency domain produced through a real FFT performed on the real-number imaginary part signal s(n) in the time domain. In other words, Equation (35) describes the filtering process performed on the complex-number signal data X(k), which is produced through an FFT.

From Equation (35), it is seen that the digital filter circuit 100 performs processes equivalent to the following three filtering processes, on the complex-number signal data in the frequency domain X(k) (=R(k)+jS(k)) as expressed by Equation (29), which is produced through an FFT performed on a complex-number signal x(n)=r(n)+js(n):

1) Filtering Process on R(k) with Coefficient V(k)

The digital filter circuit 100 first performs a filtering process with the filter coefficient V(k) on the complex-number signal data in the frequency domain R(k), which has been produced through an FFT performed on the real part signal in the time domain r(n). Thus, the filter coefficient assigned to V(k) is a complex-number filter coefficient in the frequency domain corresponding to a real-number filter coefficient that would be used for performing a filtering process on the real part signal r(n) in the time domain through real-number calculation.

2) Filtering Process on S(k) with Coefficient W(k)

Likewise, the digital filter circuit 100 performs a filtering process with the coefficient W(k) on the complex-number signal in the frequency domain S(k), which has been produced through an FFT performed on the imaginary part signal in the time-domain s(n). Thus, the filter coefficient assigned to W(k) is a complex-number filter coefficient in the frequency domain corresponding to a real-number filter coefficient that would be used for performing a filtering process on the imaginary part signal s(n) in the time domain through real-number calculation.

3) Filtering Process on Results of Filtering Processes 1) and 2) with Coefficient H(k)

Figure 10:
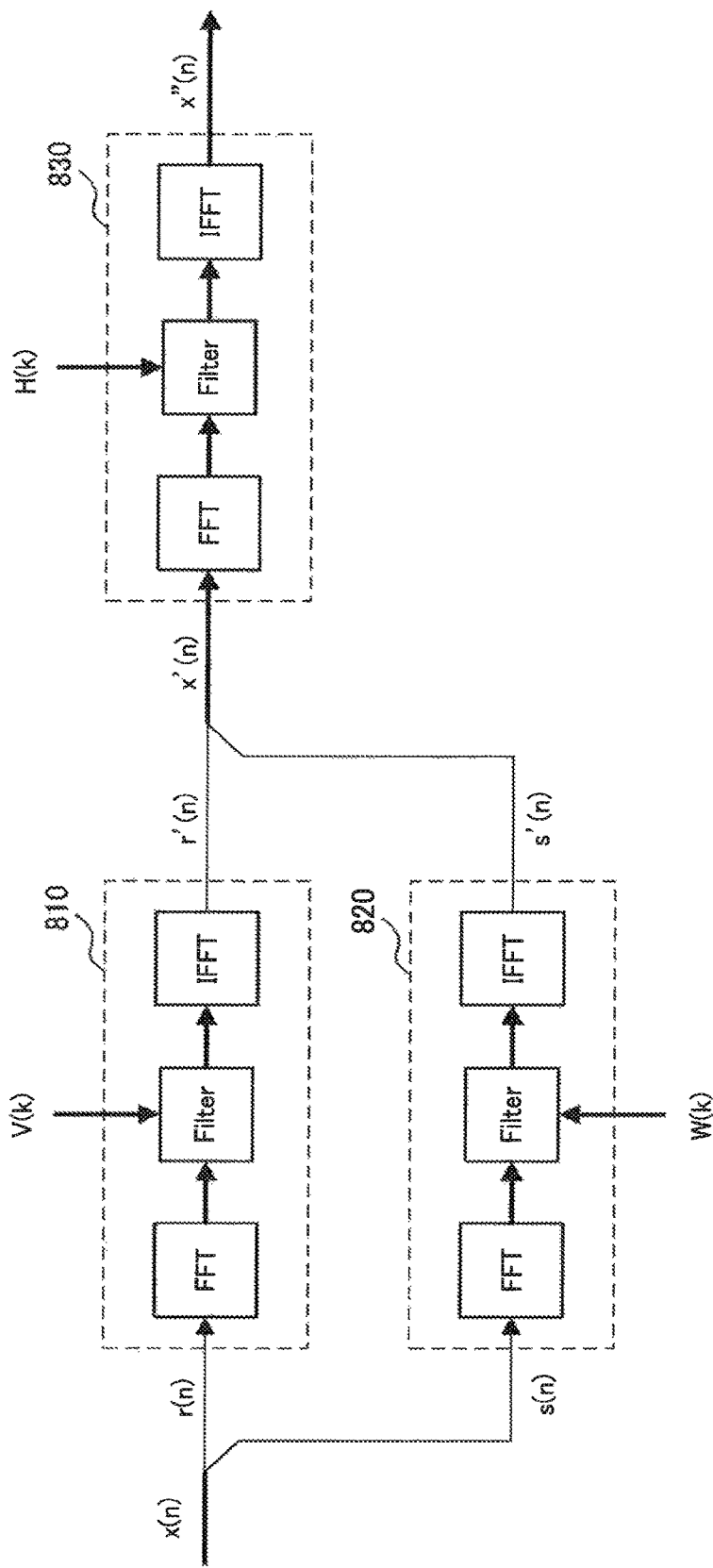
FIG. 10 is a block configuration diagram illustrating a digital filter circuit 800 in which filtering processes are performed in the frequency domain.
Figure 11:
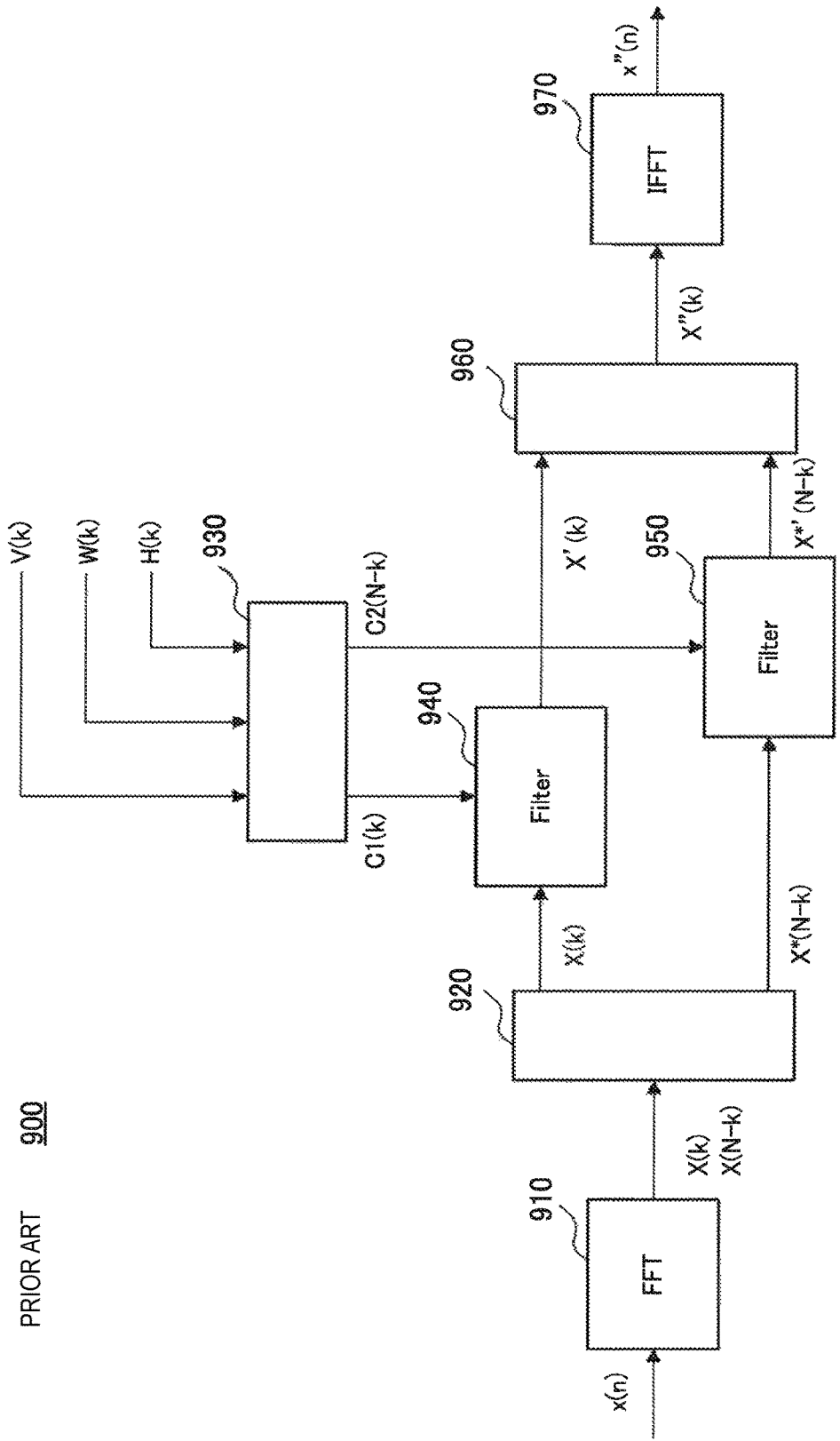
FIG. 11 is a block configuration diagram illustrating the digital filter circuit 900 according to PTL 1.

The digital filter circuit 100 further performs a filtering process with the coefficient H(k) on the complex-number signal data {R(k)V(k)+jS(k)W(k)} composed of R(k)V(k) and S(k)W(k), each of which has independently undergone either of the two filtering processes described above. The complex-number signal data {R(k)V(k)+jS(k)W(k)} is complex-number signal data in the frequency domain corresponding to a time-domain signal composed of two signals, each of which has independently undergone a filtering process performed on the real part signal r(n) or the imaginary part signal s(n) in the time domain. These signals, each of which has independently undergone a filtering process performed on the real part signal r(n) or the imaginary part signal s(n), correspond to r'(n) and s'(n) in FIG. 10. Furthermore, the time-domain signal composed of r'(n) and s'(n) corresponds to x'(n) in FIG. 10. Thus, the complex-number signal data {R(k)V(k)+jS(k)W(k)} is a frequency-domain signal corresponding to the signal x'(n) of the time-domain produced through independently performing the filtering processing on each of the real part and the imaginary part in the time domain.

Accordingly, a process equivalent to a filtering process on a complex-number signal in the time domain through complex-number calculation can be performed on the complex-number signal data in the frequency domain, {R(k)V(k)+jS(k)W(k)}, by assigning a complex-number filter coefficient of frequency-domain to H(k), where the complex-number of frequency-domain coefficient corresponds to the complex-number filter coefficient that would be used for filtering a complex-number signal x'(n) in the time domain through complex-number calculation.

As seen above, in the present example embodiment, three different coefficients V(k), W(k), and H(k) are set from outside. That is, the frequency-domain filter coefficients V(k) and W(k), which correspond to the real-number filter coefficients in the time domain for the real part and the imaginary part, respectively, of a complex-number signal x(n), and the frequency-domain coefficient H(k), which corresponds to the complex-number filter coefficient in the time domain for the complex-number signal x(n), are set. Filtering processes performed with two coefficients, $C_I(k)$ and $C_Q(k)$, which are obtained from these three coefficients, V(k), W(k), and H(k), need only one FFT before the filtering processes and only one IFFT after the filtering processes.

Figure 9:
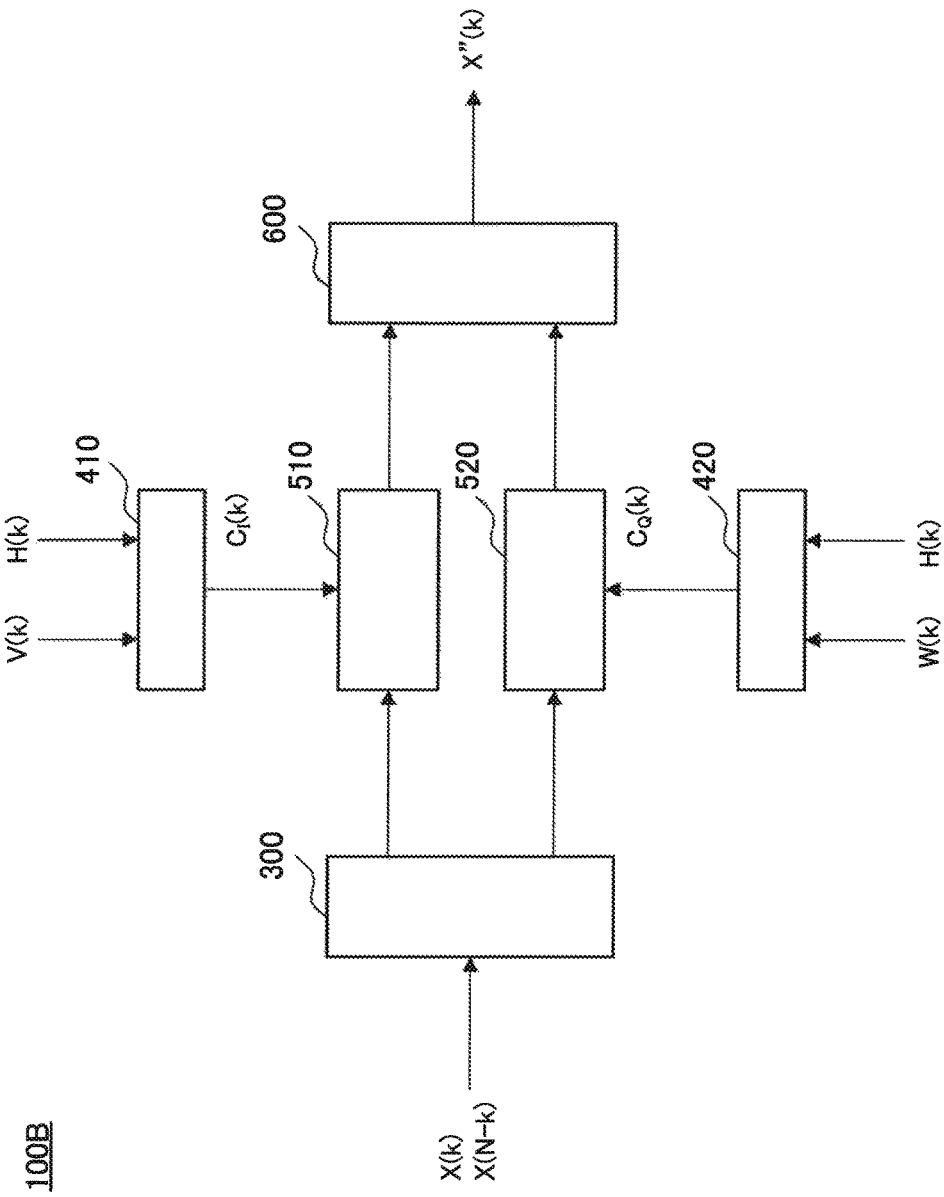
FIG. 9 is a block configuration diagram illustrating another digital filter circuit 100B according to the second example embodiment.

By the way, FFT and IFFT may be handled by circuits external to the digital filter circuit 100. In this case, the digital filter circuit 100 accepts a signal coming from an external Fourier transform circuit, performs filtering processes on the signal, and outputs the processing result to an external inverse Fourier transform circuit. FIG. 9 is a block diagram of the digital filter circuit, where FFT and IFFT are handled by external circuits. Except that the FFT circuit 200 and the IFFT circuit 700 are delete from the digital filter circuit 100 illustrated in FIG. 2, the digital filter circuit 100B in FIG. 9 is the same as the digital filter circuit 100. When the processing of the FFT and IFFT are conducted by external circuits, the number of circuits needed for each of FFT and IFFT is still one, without the need for disposing two or more circuits for handling the real part and the imaginary part, for example.

As described above, according to the present example embodiment, filtering processing is performed by using two different frequency-domain filter coefficients, V(k) and W(k), which correspond to time-domain real-number filter coefficients for the real part and the imaginary part of a complex-number signal, and one frequency-domain coefficient, H(k), which corresponds to a time-domain complex-number filter coefficient for the complex signal. In other words, frequency-domain filtering processes that correspond to filtering processes independently performed on each of the real part and the imaginary part of a complex-number signal in the time domain through real-number calculation, as well as a frequency-domain filtering process that corresponds to a filtering process performed on a complex-number signal in the time domain through complex-number calculation are performed.

Accordingly, desired filtering processes can be achieved with only one FFT circuit and only one IFFT circuit which respectively handle an FFT before the filtering processes and an IFFT after the filtering processes. As a result, the circuit size and power consumption for performing filtering processes can be reduced.

In addition, each of the filter coefficient V(k) and the coefficient W(k) for the real part and the imaginary part, respectively, of a complex-number signal is included in only either one of the two combined filter coefficients $C_I(k)$ and $C_Q(k)$, which means either one of the filter coefficients V(k) or W(k) for the real part or the imaginary part, respectively, can be changed by changing either one of the two combined filter coefficients $C_I(k)$ and $C_Q(k)$. Therefore, the process of adaptively changing filter coefficients can be simplified, thereby shortening the time for changing filter coefficients.

The present invention is not limited to the above example embodiments and includes design changes and the like that do not depart from the gist of the present invention.

INDUSTRIAL APPLICABILITY

The present invention can be widely applied to circuits that include digital filters for performing filtering processes on signals in the time domain.

The present application claims priority based on Japanese Patent Application No. 2015-009144 filed on Jan. 21, 2015, the entire disclosure of which is incorporated herein.

REFERENCE SIGNS LIST

10 Digital filter circuit
20 Separating means
30 Filter coefficient generating means
40 First filter
50 Second filter
60 Combining means
100, 100B Digital filter circuit
200 FFT circuit
300 IQ separating circuit
410, 420 Filter coefficient generating circuit
510, 520 Filter circuit
600 IQ combining circuit
700 IFFT circuit
800 Digital filter circuit
810, 820, 830 Frequency-domain filter
900 Digital filter circuit
910 FFT circuit
920 Complex conjugate generating circuit
930 Filter coefficient generating circuit
940, 950 Filter circuit
960 Complex conjugate combining circuit
970 IFFT circuit

What is claimed is:

1. A digital filter circuit comprising:
a separating circuit implemented in hardware and configured to separate a first complex-number signal in a frequency domain, into which a complex-number signal in a time domain has been transformed through a Fourier transform, into a second complex-number signal in the frequency domain and a third complex-number signal in the frequency domain, the second complex-number signal corresponding to a real part of the complex-number signal in the time domain, and the third complex-number signal corresponding to an imaginary part of the complex-number signal in the time domain;
a filter coefficient generating circuit implemented in the hardware and configured to accept inputted first, second, and third input filter coefficients that are complex-numbers, and generating a first frequency-domain filter coefficient that is a complex number from the first input filter coefficient and third input filter coefficients, and generating a second frequency-domain filter coefficient that is a complex number from the second input filter coefficient and the third input filter coefficient;

a first filter implemented in the hardware and for performing a filtering process on the second complex-number signal with the first frequency-domain filter coefficient and outputting a fourth complex-number signal;

a second filter implemented in the hardware and for performing a filtering process on the third complex-number signal with the second frequency-domain filter coefficient and outputting a fifth complex-number signal; and a combining circuit implemented in the hardware and configured to combine the fourth complex-number signal with the fifth complex-number signal and generating a sixth complex-number signal, wherein performing filtering by the digital filter circuit in a frequency domain instead of in the time domain reduces circuit size and power consumption.

2. The digital filter circuit according to claim 1,
wherein the first, second, and third input filter coefficients are complex-number filter coefficients for a filtering process in a frequency domain,
wherein the first input filter coefficient corresponds to a filter coefficient for real-number calculation on a real part of the complex-number signal in the time domain in a time-domain filtering process, that is a filtering process in the time domain on the complex-number signal in the time domain,
wherein the second input filter coefficient corresponds to a filter coefficient for real-number calculation on an imaginary part of the complex-number signal in the time domain in the time-domain filtering process, and
wherein the third input filter coefficient corresponds to a filter coefficient for complex-number calculation on the complex-number signal in the time domain in the time-domain filtering process.

3. The digital filter circuit according to claim 2, further comprising:
a Fourier transform circuit configured to transform the inputted complex-number input signal in the time domain into the first complex-number signal through the Fourier transform; and
an inverse Fourier transform circuit configured to transform the sixth complex-number signal into a complex-number signal in a time domain through an inverse Fourier transform.

4. The digital filter circuit according to claim 3,
wherein the filter coefficient generating circuit generates the first frequency-domain filter coefficient by performing a complex multiplication of the first input filter coefficient by the third input filter coefficient, and generates the second frequency-domain filter coefficient by performing a complex multiplication of the second input filter coefficient by the third input filter coefficient.

5. The digital filter circuit according to claim 2,
wherein the filter coefficient generating circuit generates the first frequency-domain filter coefficient by performing a complex multiplication of the first input filter coefficient by the third input filter coefficient, and generates the second frequency-domain filter coefficient by performing a complex multiplication of the second input filter coefficient by the third input filter coefficient.

6. The digital filter circuit according to claim 1, further comprising:
a Fourier transform circuit implemented in the hardware and configured to transform the inputted complex-number input signal in the time domain into the first complex-number signal through the Fourier transform; and
an inverse Fourier transform circuit implemented in the hardware and configured to transform the sixth complex-number signal into a complex-number signal in a time domain through an inverse Fourier transform.

7. The digital filter circuit according to claim 6,
wherein when N is a number of samples transformed through the Fourier transform and is an integer satisfying N>0,
the Fourier transform circuit outputs, as the first complex-number signal, a complex-number signal X(k) and a complex-number signal X(N−k), where k is a frequency number satisfying 0≤k≤N−1,
wherein the separating circuit comprises:
a generating circuit configured to generate a complex conjugate X*(N−k) of the outputted complex-number signal X(N−k);
a first adding circuit configured to add a real part of the outputted complex-number signal X(k) to a real part of the generated complex conjugate X*(N−k);
a second adding circuit configured to add an imaginary part of the outputted complex-number signal X(k) to an imaginary part of the generated complex conjugate X*(N−k);
a first subtracting circuit configured to subtract a real part of the generated complex conjugate X*(N−k) from a real part of the outputted complex-number signal X(k);
a second subtracting circuit configured to subtract an imaginary part of the generated complex conjugate X*(N−k) from an imaginary part of the outputted complex-number signal X(k);
a first multiplying circuit configured to multiply an output from the first adding circuit by ½;
a second multiplying circuit configured to multiply an output from the second adding circuit by ½;
a third multiplying circuit configured to multiply an output from the first subtracting circuit by ½; and
a fourth multiplying circuit configured to multiply an output from the second subtracting circuit by ½, and
wherein the second complex-number signal is generated from outputs from the first multiplying circuit and second multiplying circuit, and the third complex-number signal is generated from outputs from the third and fourth multiplying circuits.

8. The digital filter circuit according to claim 7,
wherein the first filter outputs a fourth complex-number signal XI'(k), where k is a frequency number satisfying 0≤k≤N−1,
wherein the second filter outputs a fifth complex-number signal XQ'(k), where k is a frequency number satisfying 0≤k≤N−1,
wherein the combining circuit comprises:
a third adding circuit configured to add a real part of the fourth complex-number signal XI'(k) to a real part of the fifth complex-number signal XQ'(k); and
a fourth adding circuit configured to add an imaginary part of the fourth complex-number signal XI'(k) to an imaginary part of the fifth complex-number signal XQ'(k), and
wherein the sixth complex-number signal is generated from outputs from the third and fourth adding circuits.

9. The digital filter circuit according to claim 6,
wherein the filter coefficient generating circuit generates the first frequency-domain filter coefficient by performing a complex multiplication of the first input filter coefficient by the third input filter coefficient, and generates the second frequency-domain filter coefficient by performing a complex multiplication of the second input filter coefficient by the third input filter coefficient.

10. The digital filter circuit according to claim 1,
wherein the filter coefficient generating circuit generates the first frequency-domain filter coefficient by performing a complex multiplication of the first input filter coefficient by the third input filter coefficient, and generates the second frequency-domain filter coefficient by performing a complex multiplication of the second input filter coefficient by the third input filter coefficient.

11. A signal processing device comprising:
the digital filter circuit according to claim 1.

12. A digital filter processing method, performing by a digital filter circuit, the method comprising:
separating a first complex-number signal in a frequency domain, into which a complex-number signal in a time domain has been transformed through a Fourier transform, into a second complex-number signal in the frequency domain and a third complex-number signal in the frequency domain, the second complex-number signal corresponding to a real part of the complex-number signal in the time domain, and the third complex-number signal corresponding to an imaginary part of the complex-number signal in the time domain;
generating a first frequency-domain filter coefficient that is a complex-number from a first input filter coefficient and a third input filter coefficient that are complex-numbers and have been inputted;
generating a second frequency-domain filter coefficient that is a complex-number from a second input filter coefficient that is a complex-number and the third input filter coefficients that have been inputted;
performing a filtering process on the second complex-number signal with the first frequency-domain filter coefficient and outputting a fourth complex-number signal;
performing a filtering process on the third complex-number signal with the second frequency-domain filter coefficient and outputting a fifth complex-number signal; and combining the fourth complex-number signal with the fifth complex-number signal and generating a sixth complex-number signal,
wherein performing filtering by the digital filter circuit in the frequency domain instead of in the time domain reduces circuit size and power consumption.

13. The digital filter processing method according to claim 12,
wherein the first input filter coefficient is a complex-number filter coefficient in a frequency domain, the complex-number filter coefficient corresponding to a filter coefficient for real-number calculation on a real part of the complex-number signal in the time domain in a time-domain filtering process that is a filtering process in the time domain on the complex-number signal in the time domain,
wherein the second input filter coefficient is a complex-number filter coefficient in a frequency domain, the complex-number filter coefficient corresponding to a filter coefficient for real-number calculation on an imaginary part of the complex-number signal in the time domain in the time-domain filtering process, and
wherein the third input filter coefficient is a complex-number filter coefficient in a frequency domain, the complex-number filter coefficient corresponding to a filter coefficient for complex-number calculation on the complex-number signal in the time domain in the time-domain filtering process.

14. The digital filter processing method according to claim 13, the method comprising:
transforming an inputted complex-number input signal in a time domain into the first complex-number signal through a Fourier transform; and
transforming the sixth complex-number signal generated into a complex-number signal in a time domain through an inverse Fourier transform.

15. The digital filter processing method according to claim 12, the method comprising:
transforming an inputted complex-number input signal in a time domain into the first complex-number signal through a Fourier transform; and
transforming the sixth complex-number signal generated into a complex-number signal in a time domain through an inverse Fourier transform.

* * * * *